US009773992B2

(12) United States Patent
Maruyama et al.

(10) Patent No.: US 9,773,992 B2
(45) Date of Patent: Sep. 26, 2017

(54) ORGANIC EL DISPLAY DEVICE AND METHOD OF MANUFACTURING AN ORGANIC EL DISPLAY DEVICE

(71) Applicant: Japan Display Inc., Tokyo (JP)

(72) Inventors: Satoshi Maruyama, Tokyo (JP);
Masakazu Kaida, Tokyo (JP);
Hirohisa Tanaka, Tokyo (JP);
Takanobu Takenaka, Tokyo (JP);
Noriyoshi Kanda, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 15/091,927

(22) Filed: Apr. 6, 2016

(65) Prior Publication Data

US 2016/0293878 A1     Oct. 6, 2016

(30) Foreign Application Priority Data

Apr. 6, 2015    (JP) ................. 2015-078052

(51) Int. Cl.
*H01L 51/50*     (2006.01)
*H01L 51/52*     (2006.01)
*H01L 51/56*     (2006.01)

(52) U.S. Cl.
CPC ...... *H01L 51/5012* (2013.01); *H01L 51/5056* (2013.01); *H01L 51/5212* (2013.01); *H01L 51/5271* (2013.01); *H01L 51/56* (2013.01)

(58) Field of Classification Search
CPC ............ H01L 51/5012; H01L 51/5056; H01L 51/5212; H01L 51/5271; H01L 51/56
See application file for complete search history.

(56) References Cited

U.S. PATENT DOCUMENTS

| 2007/0052356 | A1* | 3/2007 | Kawauchi | H01L 51/0017 313/512 |
| 2008/0036366 | A1* | 2/2008 | Yaegashi | H01L 51/5218 313/504 |
| 2012/0175645 | A1* | 7/2012 | Omoto | G09G 3/3233 257/88 |
| 2014/0183471 | A1* | 7/2014 | Heo | H01L 27/322 257/40 |
| 2014/0183479 | A1* | 7/2014 | Park | H01L 51/56 257/40 |
| 2014/0332781 | A1* | 11/2014 | Tokuda | H01L 27/3265 257/40 |
| 2015/0206929 | A1* | 7/2015 | Sato | H01L 27/32 257/40 |
| 2015/0228930 | A1* | 8/2015 | Murata | H01L 51/5271 257/88 |

FOREIGN PATENT DOCUMENTS

| JP | 2014-186275 A | 10/2014 |
| JP | 2015-141775 A | 8/2015 |

* cited by examiner

*Primary Examiner* — Peter Bradford
(74) *Attorney, Agent, or Firm* — Typha IP LLC

(57) ABSTRACT

An organic EL display device includes in order from a substrate side: a metal layer; an insulating layer formed on the metal layer; a first electrode layer formed on the insulating layer; an organic layer formed on the first electrode layer; and a second electrode layer formed on the organic layer. The metal layer is for use as a reflective layer configured to reflect, on a surface of the metal layer, light generated from the organic layer by applying a voltage between the first electrode layer and the second electrode layer.

5 Claims, 4 Drawing Sheets

ORGANIC EL DISPLAY DEVICE AND METHOD OF MANUFACTURING AN ORGANIC EL DISPLAY DEVICE

CROSS-REFERENCE TO RELATED APPLICATION

The present application claims priority from Japanese Application JP 2015-78052, filed on Apr. 6, 2015, the content of which is hereby incorporated by reference into this application.

BACKGROUND OF THE INVENTION

1. Field of the Invention

The present invention relates to an organic EL display device and a method of manufacturing an organic EL display device.

2. Description of the Related Art

An image display device using a self-luminous body called an organic light emitting diode (OLED) (hereinafter referred to as "organic electro-luminescent (EL) display device") has been put to practical use. In the organic EL display device, for example, an anode electrode formed on an insulating layer is sometimes also used as a reflective layer that is configured to reflect light generated from a light emitting layer (see Japanese Patent Application Laid-open No. 2014-186275). Ag has a high reflectivity, and thus, there are cases in which the anode electrode has, for example, such structure that an indium tin oxide (ITO) layer, an Ag layer, and an ITO layer are laminated so that the light generated from the light emitting layer is reflected on the surface of the Ag layer via the ITO layer.

SUMMARY OF THE INVENTION

However, when an anode electrode is formed using Ag, there are problems in that Ag is expensive, a Ag residue is generated in a Ag processing step, and processing accuracy of Ag is low.

Accordingly, one object of the present invention is to realize an organic EL display device with improved accuracy of processing a pattern of an anode electrode, which enables higher resolution display.

In one or more embodiments of the present invention, an organic EL display device includes in order from a substrate side: a metal layer; an insulating layer formed on the metal layer; a first electrode layer formed on the insulating layer; an organic layer formed on the first electrode layer; and a second electrode layer formed on the organic layer. The metal layer is for use as a reflective layer configured to reflect, on a surface of the metal layer, light generated from the organic layer by applying a voltage between the first electrode layer and the second electrode layer.

(2) In one or more embodiments of the present invention according to Item (1), the metal layer is further for use as auxiliary wiring of the second electrode layer.

(3) In one or more embodiments of the present invention according to Item (2), the metal layer and the first electrode layer sandwich the insulating layer to form an additional capacitor.

(4) In one or more embodiments of the present invention according to Item (1), the metal layer is formed so as to have structure in which an Al layer and a Mo layer are laminated. The light generated from the organic layer is reflected on a surface of the Al layer.

(5) In one or more embodiments of the present invention according to Item (1), the metal layer is formed so as to have structure in which an Al layer, a Mo layer, and an ITO layer are laminated. The light generated from the organic layer is reflected on a surface of the Al layer.

(6) In one or more embodiments of the present invention according to Item (1), the first electrode layer is formed of ITO.

(7) In one or more embodiments of the present invention, a method of manufacturing an organic EL display device, comprising, in order from a substrate side: forming a metal layer; forming an insulating layer on the metal layer; forming a first electrode layer on the insulating layer; forming an organic layer on the first electrode layer; and forming a second electrode layer on the organic layer. The metal layer is for use as a reflective layer configured to reflect, on a surface of the metal layer, light generated from the organic layer by applying a voltage between the first electrode layer and the second electrode layer.

DETAILED DESCRIPTION OF THE INVENTION

Figure 1:
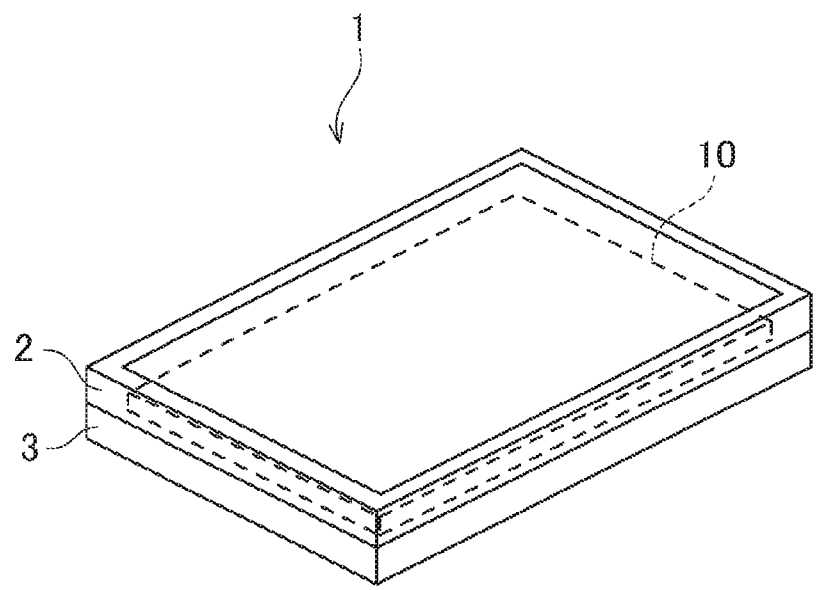
FIG. 1 is a schematic view for illustrating an organic EL display device according to an embodiment of the present invention.

Referring to the accompanying drawings, an embodiment of the present invention is described below. In the drawings, the same or similar components are denoted by the same reference symbols, and repetitive description thereof is omitted.

FIG. 1 is a schematic view for illustrating an organic EL display device 1 according to an embodiment of the present invention. The organic EL display device 1 includes an upper frame 2, a lower frame 3, and an organic EL panel 10 fixed so as to be sandwiched between the upper frame 2 and the lower frame 3. The schematic view of FIG. 1 is only exemplary, and this embodiment is not limited thereto. For example, the organic EL display device 1 may include only the organic EL panel without the upper frame 2 and the lower frame 3.

Figure 2:
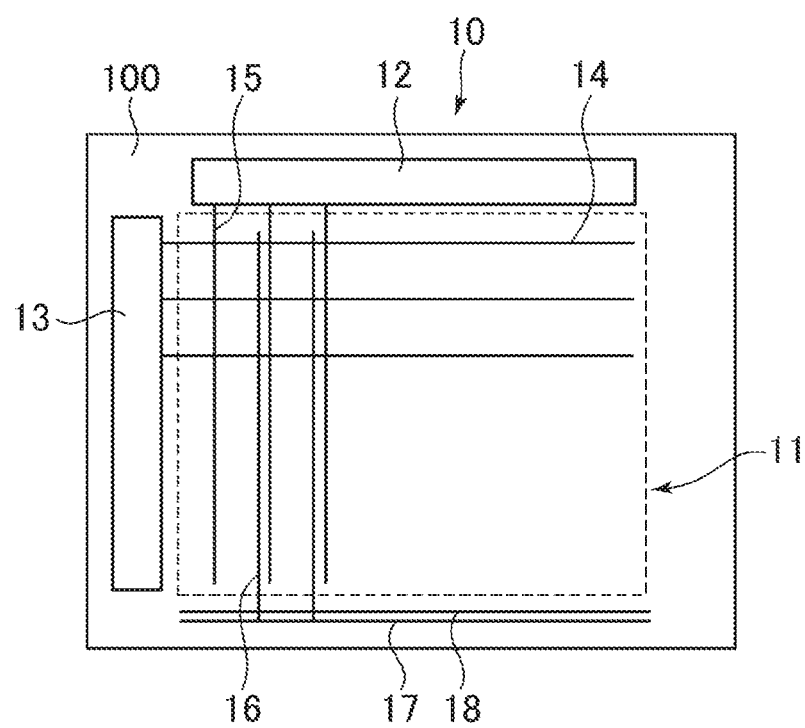
FIG. 2 is a schematic view for illustrating a circuit configuration of the organic EL display device.

FIG. 2 is a schematic view for illustrating a circuit configuration of the organic EL display device 1 illustrated in FIG. 1. The organic EL panel 10 is configured to control pixels formed in a display region 11 on a substrate 100 by a data drive circuit 12 and a scanning drive circuit 13, to thereby display an image. In this case, for example, the data drive circuit 12 is an integrated circuit (IC) that is configured to generate and send a data signal to the pixels, and the scanning drive circuit 13 is an IC that is configured to generate and send a gate signal to thin film transistors (TFTs) formed in the respective pixels. With reference to FIG. 2, the data drive circuit 12 and the scanning drive circuit 13 are illustrated as being formed at different places, but may be incorporated into one IC, and may be formed as a circuit directly routed on the substrate 100.

Figure 3:
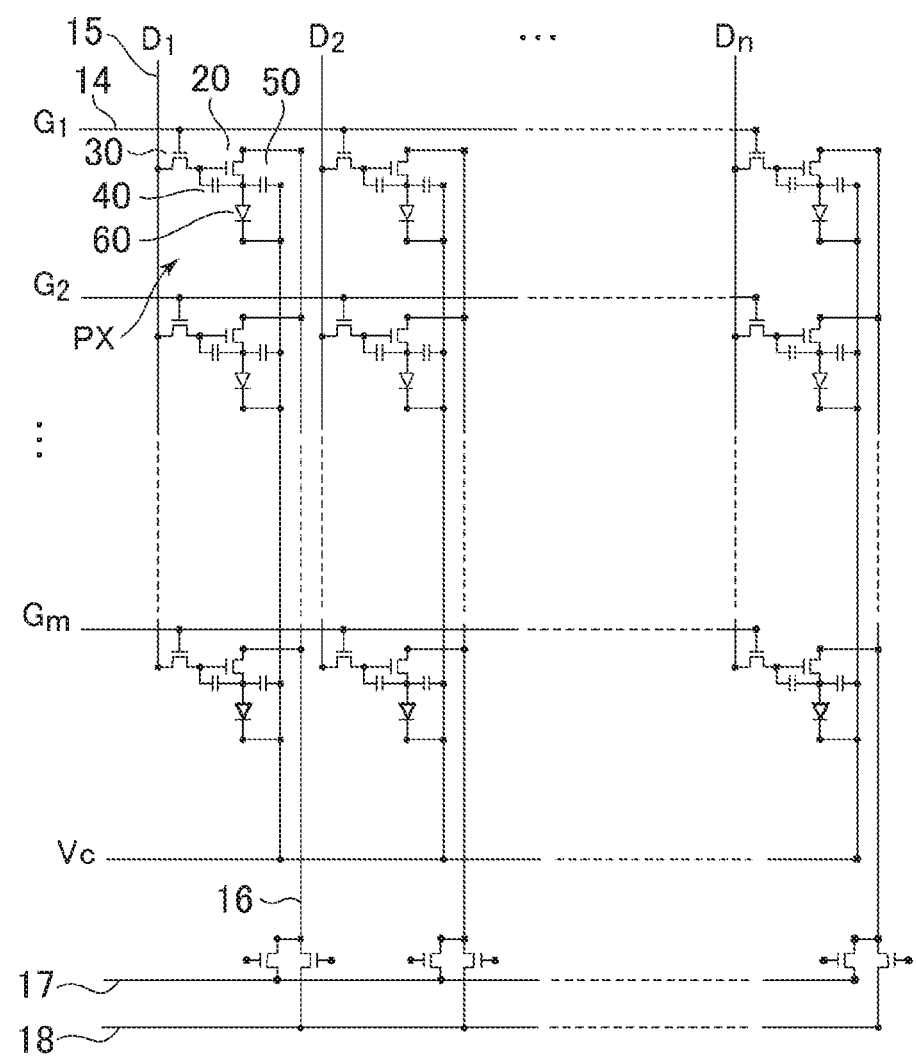
FIG. 3 is a schematic diagram for illustrating the configuration of pixels of the organic EL display device.

A scanning line 14, which is configured to transmit a signal from the scanning drive circuit 13, is connected to a gate electrode of a switch transistor 30 as illustrated in FIG. 3. Further, a data line 15, which is configured to transmit a signal from the data drive circuit 12, is connected to a source/drain electrode of the switch transistor 30. A reference potential for light emission by an organic light emitting diode 60 is applied to potential wiring 16, and the potential wiring 16 is connected to a source/drain electrode of a driver transistor 20. A first potential supply wiring 17 and a second potential supply wiring 18 are connected to a potential supply source, and are connected to the potential wiring 16 to transistors, respectively. The circuit configuration illustrated in FIG. 2 is only exemplary, and this embodiment is not limited thereto.

FIG. 3 is a circuit diagram of the organic EL display device according to this embodiment. In the display region 11 of the organic EL panel 10, n data lines 15 (D1 to Dn) and m scanning lines 14 (G1 to Gm) are formed. A plurality of pixels PX are arranged in a matrix-like manner in a direction of extension of the scanning lines 14 and in a direction of extension of the data lines 15. For example, a pixel DX is formed in a portion surrounded by G1, G2, D1, and D2.

The first scanning line G1 is connected to the gate electrode of the switch transistor 30. When a signal is applied from the scanning drive circuit 13, the switch transistor 30 is in an ON state. Then, when a signal is applied from the data drive circuit 12 to the first data line D1, charge is accumulated in an accumulation capacitor 40, a voltage is applied to a gate electrode of the driver transistor 20, and the driver transistor 20 is in the ON state. Even when the switch transistor 30 is set to an OFF state at this time, due to the charge accumulated in the accumulation capacitor 40, the driver transistor 20 stays in the ON state for a certain period. An anode of the organic light emitting diode 60 is connected to the potential wiring 16 via the drain and the source of the driver transistor 20, and a cathode of the organic light emitting diode 60 is fixed to a reference potential Vc. Thus, a current depending on a gate voltage of the driver transistor 20 flows through the organic light emitting diode 60, and the organic light emitting diode 60 emits light. Further, an additional capacitor 50 is formed between the anode and the cathode of the organic light emitting diode 60. The additional capacitor 50 has an effect of stabilizing a voltage written in the accumulation capacitor 40 and contributes to stable operation of the organic light emitting diode 60. Specifically, the effect is obtained by setting the additional capacitor 50 to have a capacitance larger than a capacitance of the accumulation capacitor 40.

Figure 4:
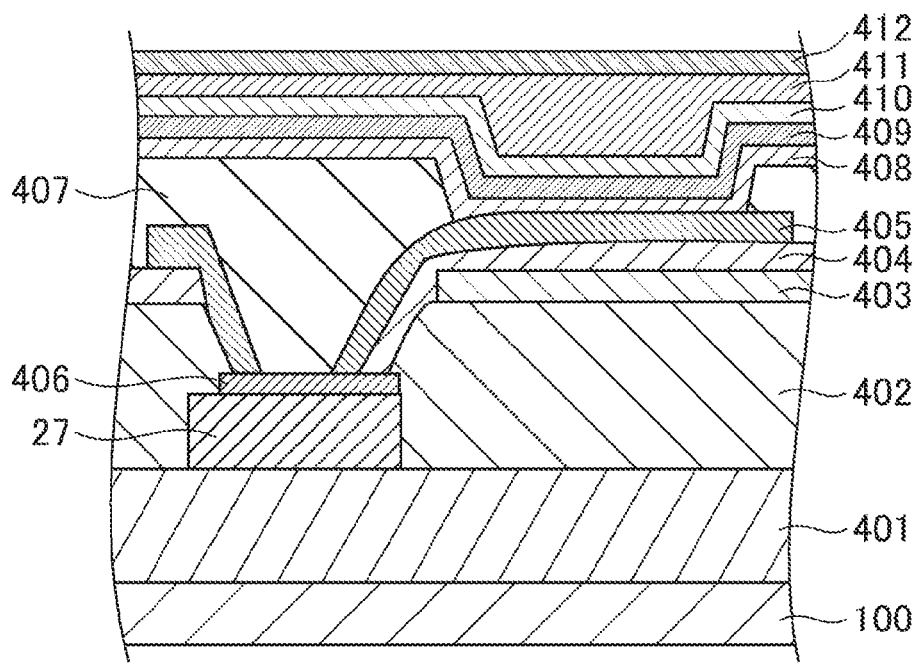
FIG. 4 is a partial schematic sectional view of the organic EL display device.

FIG. 4 is a partial schematic sectional view of the organic EL display device. FIG. 4 is a schematic sectional view taken along the line IV-IV of FIG. 6. As illustrated in FIG. 4, a TFT layer 401 having a TFT for driving the pixel and the like formed thereon is formed on the substrate 100.

Figure 5:
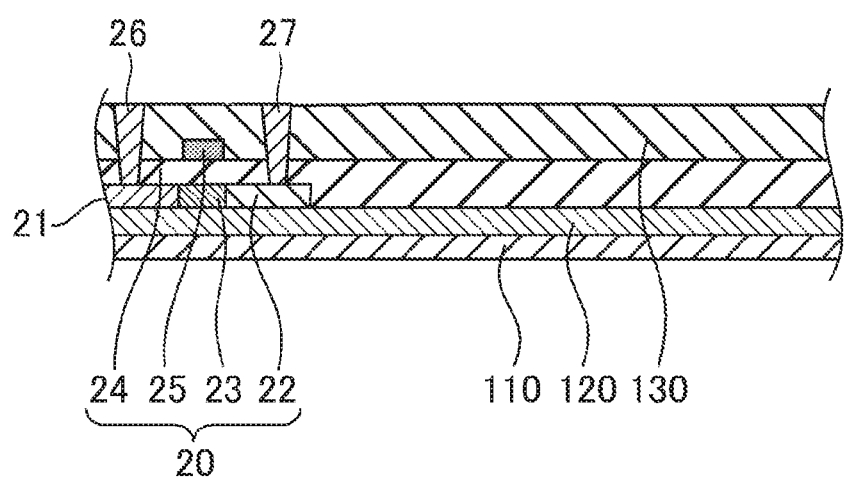
FIG. 5 is a schematic sectional view of a TFT layer.

FIG. 5 is a schematic sectional view of the TFT layer 401. As can be seen from FIG. 4 and FIG. 5, a first base film 110 formed of, for example, SiNx is formed, and further, a second base film 120 formed of, for example, SiOx is formed on the substrate 100. A drain electrode layer 21, a source electrode layer 22, and a channel layer 23 are formed on the second base film 120. After a gate insulating film 24 is formed so as to cover the drain electrode layer 21, the source electrode layer 22, the channel layer 23, and the second base film 120, a gate electrode layer 25 is formed above the channel layer 23. A first interlayer insulating film 130 is laminated so as to cover the gate electrode layer 25 and the gate insulating film 24, and through holes that reach the drain electrode layer 21 and the source electrode layer 22, respectively, are formed. A drain electrode 26 and a source electrode 27 are formed in the through holes, respectively.

Then, as illustrated in FIG. 4, a planarizing layer 402 is laminated so as to cover the drain electrode 26, the source electrode 27, and the first interlayer insulating film 130. A metal layer 403, an insulating layer 404, and an anode electrode 405 are formed in this order on the planarizing layer 402. In this case, the metal layer 403 is formed so as to have laminated structure in which, for example, an Al layer is laminated on a Mo layer, and light generated from a light emitting layer is reflected on a surface of the metal layer 403 (Al layer). The metal layer 403 may have other structure insofar as the surface thereof can secure a predetermined or higher reflectivity. Specifically, the metal layer 403 may be formed by laminating, for example, an ITO layer, a Mo layer, and an Al layer in this order from bottom in FIG. 4.

Through electrical connection between the metal layer 403 and a cathode electrode 409 to be described below, the metal layer 403 is used as auxiliary wiring of power source wiring of the cathode electrode 409. Further, the metal layer 403 and the anode electrode 405 sandwich the insulating layer 404 to form a capacitor layer (additional capacitor 50). The electrical connection between the metal layer 403 and the cathode is made by, for example, a through hole formed outside the display region.

The insulating layer 404 is formed of, for example, SiN. Further, the anode electrode 405 does not contain Ag, and is formed of, for example, ITO. As a material of the anode electrode 405, other materials, for example, indium tin oxide (IZO) or zinc oxide (ZnO) may be used.

Further, as illustrated in FIG. 4, a through hole is formed in the planarizing layer 402 on the source electrode 27. An ITO layer 406 is formed at the bottom of the through hole, and the insulating layer 404 and the anode electrode 405 are laminated on a side surface of the through hole on a light emitting region side. Further, the anode electrode 405 is laminated on a side surface of the through hole on an opposite side.

Further, a RIB layer 407 that isolates pixels from one another is formed on the structure described above. An organic layer 408 is formed on the RIB layer 407 and the anode electrode 405. In this case, a region in which the anode electrode 405 and the organic layer 408 are in contact with each other is the light emitting region, and the RIB layer 407 defines an edge of the light emitting region.

The cathode electrode 409 is formed on the organic layer 408. The cathode electrode 409 is a transparent electrode formed of, for example, ITO or IZO. The cathode electrode 409 may be formed across some or all of the pixels PX arranged in the matrix-like manner. The organic layer 408 is formed by laminating, for example, a hole transport layer, a light emitting layer, and an electron transport layer in this order from the anode electrode 405 side in a well known manner, and thus, detailed description thereof is omitted.

A sealing layer 410 is formed on the cathode electrode 409, and a sealing member 412 is formed above the sealing layer 410. A filler 411 formed of a resin material or the like is sealed between the sealing layer 410 and the sealing member 412.

Figure 6:
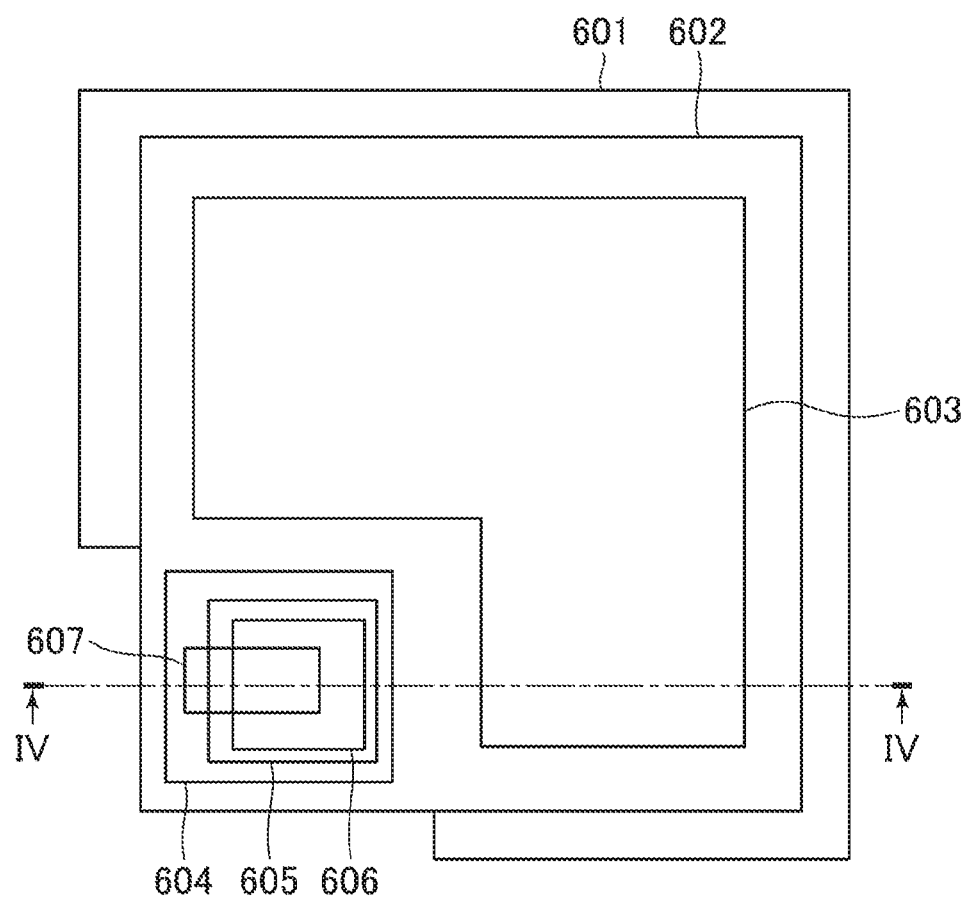
FIG. 6 is a schematic plan view of a portion illustrated in the sectional view of FIG. 5.

FIG. 6 is a schematic plan view of a portion illustrated in the sectional view of FIG. 5. FIG. 4 is a schematic sectional view taken along the line IV-IV of FIG. 6. As illustrated in FIG. 6, the metal layer 403, the anode electrode 405, and the RIB layer 407 are laminated in this order from bottom in FIG. 4. With reference to FIG. 6, the metal layer 403 is primarily formed in a region 601, and the anode electrode 405 is primarily formed in a region 602. The RIB layer 407 primarily defines a light emitting region 603. The source electrode 27 is primarily formed in a region 604, and the ITO layer 406 is primarily formed in a region 605. The planarizing layer 402 primarily defines a through hole 606, and the insulating layer 404 primarily defines a through hole 607.

Next, operation of the organic EL display device of this embodiment is described. When a voltage is applied between the cathode electrode 409 and the anode electrode 405, holes are injected from the anode electrode 405 into the hole transport layer of the organic layer 408, and electrons are injected from the cathode electrode 409 into the electron transport layer of the organic layer 408. The injected electrons and holes reach the light emitting layer of the organic layer 408, and the electrons and holes are recombined to generate light of a predetermined wavelength. Part of the light generated in the light emitting layer is emitted to the cathode electrode 409 side to be visually recognized by an observer. Part of the light generated in the light emitting layer, which is emitted to the anode electrode 405 side, is reflected on the surface of the metal layer 403 to be directed to the cathode electrode 409 side. The light emitted to the anode electrode 405 side is partly reflected on a surface of the anode electrode 405 to be directed to the cathode electrode 409 side. The same can be said with regard to external light that enters from the cathode electrode 409 side.

Next, a method of manufacturing the organic EL display device according to this embodiment is schematically described. The planarizing layer 402 is formed on the TFT layer 401 having the TFT and the like formed thereon. Then, the metal layer 403 is formed on the planarizing layer 402 in a region corresponding to a pixel region. In this case, as illustrated in FIG. 6, the metal layer 403 has an area that is larger than that of the light emitting region. Then, the insulating layer 404 is formed on the metal layer 403. Then, the anode electrode 405 is formed on the insulating layer 404. Then, the RIB layer 407 is formed on the anode electrode 405. After that, as described above, the through hole that defines the light emitting region is formed in the RIB layer 407, and the organic layer 408 and the like are formed, to thereby realize the organic EL display device 1. The TFT layer 401, the organic layer 408 on the RIB layer 407, and the like are formed in a well known manner, and thus, description thereof is omitted.

According to this embodiment, for example, the surface of the metal layer 403 (in this embodiment, the surface of the Al layer) can be used as a reflective layer, and, compared with a case in which, for example, a reflective layer containing Ag or the like is formed in the anode electrode 405, the necessity of forming and processing a Ag layer is eliminated. This can reduce the number of process steps in manufacturing the organic EL display device 1. Further, compared with the case in which the anode electrode 405 including a Ag layer is formed, because the anode electrode 405 can be formed without the Ag layer, processing accuracy of the anode electrode 405 can be enhanced to enable higher resolution image display. Further, Al or the like used in this embodiment has a lower reflectivity than that of Ag, but, compared with the case in which the Ag layer is used as the reflective layer, the processing accuracy of the anode electrode 405 can be enhanced as described above, which can compensate for the lowered reflectivity due to no use of the Ag layer as the reflective layer. Further, the necessity of forming the Ag layer or the like in the anode electrode 405 is eliminated, and thus, the organic EL display device 1 that is thinner can be realized at lower cost.

The present invention is not limited to the above-mentioned embodiment. The structure described in the above-mentioned embodiment may be replaced by substantially the same structure, structure having the same action and effect, and structure that may achieve the same object. A first electrode layer and a second electrode layer in the attached claims correspond to, for example, the anode electrode 405 and the cathode electrode 409, respectively, described above.

What is claimed is:

1. An organic EL display device comprising, in order from a substrate side:
    a metal layer;
    an insulating layer formed on the metal layer;
    a first electrode layer formed on the insulating layer;
    an organic layer formed on the first electrode layer; and
    a second electrode layer formed on the organic layer,
    wherein the metal layer is formed so as to have structure in which an Al layer, a Mo layer, and an ITO layer are laminated, and
    wherein the metal layer is for use as a reflective layer configured to reflect, on a surface of the Al layer, light generated from the organic layer by applying a voltage between the first electrode layer and the second electrode layer.

2. The organic EL display device according to claim 1, wherein the metal layer is further for use as auxiliary wiring of the second electrode layer.

3. The organic EL display device according to claim 1, wherein the metal layer and the first electrode layer sandwich the insulating layer to form an additional capacitor.

4. The organic EL display device according to claim 1, wherein the first electrode layer is formed of ITO.

5. A method of manufacturing an organic EL display device, comprising, in order from a substrate side:
    forming a metal layer;
    forming an insulating layer on the metal layer;
    forming a first electrode layer on the insulating layer;
    forming an organic layer on the first electrode layer; and
    forming a second electrode layer on the organic layer,
    wherein the metal layer is formed so as to have structure in which an Al layer, a Mo layer, and an ITO layer are laminated, and
    wherein the metal layer is for use as a reflective layer configured to reflect, on a surface of the Al layer, light generated from the organic layer by applying a voltage between the first electrode layer and the second electrode layer.

* * * * *